United States Patent [19]
Camilletti et al.

[11] Patent Number: 5,863,595
[45] Date of Patent: Jan. 26, 1999

[54] THICK CERAMIC COATINGS FOR ELECTRONIC DEVICES

[75] Inventors: Robert Charles Camilletti, Midland, Mich.; Diana Kay Deese, Spring Lake, N.C.; Loren Andrew Haluska, Midland, Mich.; Mark Jon Loboda, Midland, Mich.; Keith Winton Michael, Midland, Mich.

[73] Assignee: Dow Corning Corporation, Midland, Mich.

[21] Appl. No.: 780,946

[22] Filed: Jan. 10, 1997

Related U.S. Application Data

[63] Continuation-in-part of Ser. No. 725,791, Oct. 4, 1996, Pat. No. 5,730,792.

[51] Int. Cl.⁶ ........................................................ B05D 5/12
[52] U.S. Cl. ........................ 427/58; 106/419.2; 106/419.7
[58] Field of Search ............................... 427/226, 58, 377, 427/249, 255.1, 419.7, 419.2

[56] References Cited

U.S. PATENT DOCUMENTS

| | | | |
|---|---|---|---|
| 3,986,997 | 10/1976 | Clark | 260/29.2 |
| 4,689,085 | 8/1987 | Plueddemann | 106/287 |
| 4,749,631 | 6/1988 | Haluska et al. | 428/704 |
| 4,756,977 | 7/1988 | Haluska et al. | 428/704 |
| 4,911,992 | 3/1990 | Haluska et al. | 427/58 |
| 5,011,706 | 4/1991 | Tarhay | 427/39 |
| 5,290,354 | 3/1994 | Haluska | 427/58 |
| 5,399,441 | 3/1995 | Bearinger | 428/689 |
| 5,436,084 | 7/1995 | Haluska | 428/688 |
| 5,711,987 | 1/1998 | Bearing et al. | 427/58 |

*Primary Examiner*—Janyce Bell
*Attorney, Agent, or Firm*—Sharon K. Severance

[57] ABSTRACT

This invention pertains to a method of forming a coating on an electronic substrate and to the electronic substrates coated thereby. The method comprises applying on the electronic substrate a coating composition comprising an aqueous alkanol dispersion of colloidal silica and partial condensate of $RSi(OH)_3$ where R is selected from the group consisting of an alkyl radical having from 1 to 3 carbon atoms, the vinyl radical, the 3,3,3-trifluoropropyl radical, the gamma-glycidoxypropyl radical and the gamma-methacryloxypropyl radical with the provision that at least 70% of the R radicals are methyl, and thereafter ceramifying the coating by heating at a temperature of about 200° C. to 1000° C. The use of the coating composition comprising an aqueous alkanol dispersion of colloidal silica and partial condensate of $RSi(OH)_3$ allows for the formation of thick planarizing coatings on the electronic substrate.

12 Claims, No Drawings

THICK CERAMIC COATINGS FOR ELECTRONIC DEVICES

This application is a continuation-in-part of application Ser. No. 08/725,791 filed on Oct. 4, 1996, now U.S. Pat. No. 5,730,792.

BACKGROUND OF THE INVENTION

This invention is a method of forming coatings using compositions containing a methyl silsesquioxane resin and colloidal silica as coating for electronic devices.

The use of hydrogen silsesquioxane resin $(HSiO_{3/2})_n$ derived ceramic coatings on substrates such as electronic devices is known. U.S. Pat. No. 4,756,977 to Haluska et al. discloses a process of forming a silica coating on an electronic substrate by applying to the substrate a solution of hydrogen silsesquioxane resin and thereafter heating the coated substrate in air at a temperature in the range of 200°–1,000° C. However, it is not possible to produce thick planarizing coatings from hydrogen silsesquioxane resins.

The use of hydrolyzed or partially hydrolyzed silicate esters derived ceramic coatings on substrates such as electronic devices is known. U.S. Pat. No. 4,749,631 to Haluska et al. discloses a process for forming a silica coating on an electronic substrate by applying to the substrate a solution of a hydrolyzed or partially hydrolyzed silicate ester and thereafter heating the coated substrate at a temperature in the range of 200° to 1,000° C.

The use of an acidic dispersion of colloidal silica and partial condensate of $RSi(OH)_3$ to produce abrasion resistant coatings is known. U.S. Pat. No. 3,986,997 to Clark describes a coating composition containing an acidic dispersion of colloidal silica, and partial condensate of methylsilanetriol in an alcohol-water medium. The coating composition can be used to apply transparent abrasion resistant coatings on a variety of substrates. However, U.S. Pat. No. 3,986,997 does not teach producing a ceramic or ceramic-like coating from the acidic dispersion or the use of the acidic dispersion to form planarizing coatings on electronic substrates.

SUMMARY OF THE INVENTION

This invention pertains to a method of forming a coating on an electronic substrate and to the electronic substrates coated thereby. The method comprises applying on the electronic substrate a coating composition comprising an aqueous alkanol dispersion of colloidal silica and partial condensate of $RSi(OH)_3$ where R is selected from the group consisting of an alkyl radical having from 1 to 3 carbon atoms, the vinyl radical, the 3,3,3-trifluoropropyl radical, the gamma-glycidoxypropyl radical and the gamma-methacryloxypropyl radical with the provision that at least 70% of the R radicals are methyl, and thereafter ceramifying the coating by heating at a temperature of about 200° C. to 1000° C. The use of the coating composition comprising an aqueous alkanol dispersion of colloidal silica and partial condensate of $RSi(OH)_3$ allows for the formation of thick planarizing coatings on the electronic substrate.

THE INVENTION

This invention pertains to the use of an aqueous alkanol dispersion of colloidal silica and partial condensate of $RSi(OH)_3$ where R is selected from the group consisting of an alkyl radical having from 1 to 3 carbon atoms, the vinyl radical, the 3,3,3-trifluoropropyl radical, the gamma-glycidoxypropyl radical and the gamma-methacryloxypropyl radical with the provision that at least 70% of the R radicals are methyl; to produce ceramic coatings on electronic substrates and to the electronic substrates having the coating formed thereon. By "electronic substrate" it is meant to include silicon based devices and gallium arsenide based devices intended for use in the manufacture of a semiconductor component including focal plane arrays, opto-electronic devices, photovoltaic cells, optical devices, transistor-like devices, 3-D devices, silicon-on-insulator devices, super lattice devices and the like. To further exemplify, electronic substrates include wafers resulting from the fabrication of integrated circuits and semiconductor devices. Typically the devices are completely fabricated up to the point of the interconnect system, usually bond pads, while still in the wafer stage. It is desirable and economical to apply these coatings to the electronic devices while they are still in the wafer stage as an electronic substrate. Such coated devices are then separated from each other and continued into the packaging and assembly stages. Alternately, the electronic substrates can be the actual separated semiconductor devices or integrated circuit devices, before or after the interconnects are made to an electronic assembly.

A ceramic coating is formed on a substrate by applying a coating composition comprising an aqueous alkanol dispersion of colloidal silica and partial condensate of $RSi(OH)_3$ onto the substrate, and then heating and pyrolyzing the coated substrate at a temperature sufficient to convert the coating composition to a ceramic coating. By "ceramic" it is meant to include both amorphous silica ($SiO_2$) materials as well as amorphous silica-like materials that are not fully free of residual carbon, silanol (SiOH) and/or hydrogen and which may contain additional ceramic materials.

Aqueous alkanol dispersions of colloidal silica and partial condensate of $RSi(OH)_3$ where R is as described above are known in the art and are described in U.S. Pat. No. 3,986,997 to Clark, herein incorporated by reference for its teaching of these compositions. Specifically taught in Clark is a coating composition comprising a dispersion containing colloidal silica and a partial condensate of methylsilanetriol.

The silica component of the coating composition is present as an aqueous colloidal silica dispersion having a particle diameter of 5–150 millimicrons (nanometers). The partial condensate component of the coating composition is predominately derived from methylsilanetriol, but may contain other silanols of the formula $RSi(OH)_3$ in which R is an alkyl radical of 2 or 3 carbon atoms; the vinyl radical ($CH_2$=$CH$—); the 3,3,3-trifluoropropyl radical ($CF_3CH_2CH_2$—); the 3-glycidoxypropyl radical, or the 3-methacryloxypropyl radical ($CH_2$=$C(CH_3)$ $COOCH_2CH_2CH_2$—). At least 70 weight percent of the silanol is $CH_3Si(OH)_3$.

Preferably, the aqueous alkanol dispersion of colloidal silica and partial condensate of $RSi(OH)_3$ contains 10–50 weight percent solids, with the distribution being 10–70 weight percent colloidal silica and 30–90 weight percent of the partial condensate. The partial condensate component is carried in a lower aliphatic alcohol-water solvent, i.e., methanol, ethanol, isopropanol, n-butyl alcohol, or mixtures thereof.

The aqueous alkanol dispersions of colloidal silica and partial condensate of $RSi(OH)_3$ where R is as described above, is prepared by adding a trialkoxysilane $RSi(OCH_3)_3$ to a colloidal silica hydrosol, and adjusting the pH to 3–6 with an organic acid such as acetic acid. Trisilanols are generated in situ by adding the trialkoxysilane to the acidic aqueous dispersion of colloidal silica. Upon generation of the silanol in the acidic aqueous medium, there occurs a partial condensation of hydroxyl substituents to form ≡—Si—O—Si—≡ bonding. Alcohol is also generated by hydrolysis of the alkoxy substituents of the silane. Depending upon the percent solids desired, additional alcohol, water, or water-miscible solvent can be added, to adjust the level of solids in the coating composition. This coating composition is a clear or slightly hazy low viscosity fluid which is stable for several days, but condensation of —SiOH will continue at a very slow rate, and the coating composition eventually forms a gel structure.

The coating composition may optionally contain other ceramic oxide precursors, examples of which are compounds of various metals such as aluminum, titanium, zirconium, tantalum, niobium, or vanadium; and non-metallic compounds such as boron or phosphorous; any of which may be dissolved in solution, hydrolyzed, and subsequently pyrolyzed to form ceramic oxide coatings.

These ceramic oxide precursor compounds generally have one or more hydrolyzable groups bonded to the metal or non-metal depending on the valence of the metal. The number of hydrolyzable groups included in such compounds is not critical provided the compound is soluble in the solvent. Likewise, selection of an exact hydrolyzable substituent is not critical since it will be either hydrolyzed or pyrolyzed out of the system.

Typical hydrolyzable substituents include alkoxy groups such as methoxy, propoxy, butoxy and hexoxy; acyloxy groups such as acetoxy; and other organic groups bonded to the metal or non-metal through an oxygen atom such as acetylacetonate. Some specific compounds that can be used are zirconium tetracetylacetonate, titanium dibutoxy diacetylacetonate, aluminum triacetylacetonate, and tetraisobutoxy titanium.

When the coating composition is combined with one of these ceramic oxide precursors, generally it is used in an amount such that the final ceramic coating contains 0.1–30 percent by weight of the modifying ceramic oxide precursor.

The coating composition may contain a platinum, rhodium, or copper catalyst, to increase the rate and extent of conversion of the precursors to silica. Generally, any platinum, rhodium, or copper compound or complex which can be solubilized is appropriate, such as platinum acetylacetonate, rhodium catalyst $RhCl_3[S(CH_2CH_2CH_2CH_3)_2]_3$ a product of Dow Corning Corporation, Midland, Mich., or cupric naphthenate. These catalysts can be added in amounts of 5 to 1,000 parts per million of platinum, rhodium, or copper, based on the weight of the coating composition.

The coating composition is then coated onto the substrate. The coating composition can be applied by spin coating, dip coating, spray coating, or flow coating. Any other equivalent coating method can also be employed such as by applying the coating composition on a substrate or device by silk screening, screen printing, meniscus coating, or wave solder coating.

The solvent is allowed to evaporate from the coated substrate resulting in deposition of the coating. Any means of evaporation may be used such as air drying by exposure to an ambient environment, or by application of vacuum or mild heat (i.e., less than 50° C.) during early stages of the heat treatment. When spin coating is used, any additional drying period is minimized as spinning drives off the solvent to some extent.

Following removal of solvent, the coating composition is converted to a ceramic coating by pyrolysis, i.e., heating it to a sufficient temperature to ceramify. Generally, this temperature is in the range of about 200° C. to about 1,000° C. depending on the pyrolysis atmosphere. Preferred temperatures are in the range of 200° C. to 800° C. Heating is conducted for a time sufficient to ceramify the coating composition. Generally, heating will require one to 6 hours, but typically less than about 3 hours will be adequate.

Heating to ceramify the coating composition may be conducted at atmospheric pressures varying from vacuum to superatmospheric, and under an oxidizing or non-oxidizing gaseous environment such as air, oxygen, an inert gas such as nitrogen, ammonia, an amine, moisture, or nitrous oxide. Heating can be carried out using a convection oven, a rapid thermal process, a hot plate, radiant energy, or microwave energy. The rate of heating is not critical although it is practical to heat the coating composition as rapidly as possible.

What differentiates this invention from that described in U.S. Pat. No. 3,986,997 to Clark, is that in this invention the methyl groups on $CH_3SiO_{3/2}$ are oxidized to form $SiO_2$. The oxidation may not be complete due to the thickness of the coating composition, so that some methyl groups on silicon will remain. In Clark, by contrast, all of the methyl groups remain on silicon, and curing of the resin in Clark occurs through a condensation of the silanol and methoxy groups at temperatures in the range of 50°–150° C. Therefore, Clark employs a condensation cure, while in this invention, we utilize oxidation and thermal rearrangement, although some condensation may occur during the period of heating.

The thickness of the ceramic coating can vary over a wide range, but is typically from 1–500 microns. These ceramic coatings are able to smooth irregular surfaces of various substrates. The coatings are (i) relatively defect free, (ii) have excellent adhesive properties, and (iii) have a variety of electrical properties, i.e., DK's less than four and up to conductive coatings. As such, such coatings are particularly useful for electronic applications such as dielectric layers, protective layers, and conductive layers.

If desired, additional coatings may be applied over the ceramic coating. These additional coatings include $SiO_2$ coatings, $SiO_2$/ceramic oxide layers, silicon-containing coatings, silicon carbon containing coatings, silicon nitrogen containing coatings, silicon oxygen nitrogen containing coatings, silicon nitrogen carbon containing coatings, and diamond-like carbon coatings. Methods for applying such coatings are described in U.S. Pat. No. 4,756,977, referred to previously. An especially preferred additional coating is silicon carbide.

The method of applying an additional coating such as silicon carbide is not critical, and such coatings can be applied by any chemical vapor deposition technique such as thermal chemical vapor deposition (TCVD), photochemical vapor deposition, plasma enhanced chemical vapor deposition (PECVD), electron cyclotron resonance (ECR), and jet vapor deposition. It could also be applied by physical vapor deposition techniques such as sputtering or electron beam evaporation. These processes involve either the addition of energy in the form of heat or plasma to a vaporized species to cause the desired reaction, or they focus energy on a solid sample of the material to cause its deposition.

For example, in thermal chemical vapor deposition, the coating is deposited by passing a stream of the desired precursor gas over a heated substrate. When the precursor gas contacts the hot surface, it reacts and deposits the coating. Substrate temperatures in the range of 25° C. to 1,000° C. are sufficient to form these coatings in several minutes to several hours, depending on the precursor gas and the thickness of the coating. Reactive metals can be used in such a process to facilitate deposition.

In PECVD techniques, a precursor gas is reacted by passing it through a plasma field. Reactive species are formed and focused at the substrate where they readily adhere. The advantage of a PECVD process over a thermal CVD process is that in the former, lower substrate and processing temperatures can be used, i.e., 25° C. to 600° C.

Plasma used in a PECVD process can be energy derived from electric discharges, electromagnetic fields in the radio-frequency or microwave range, lasers, or particle beams. In most plasma deposition processes, it is preferred to use radio frequency (i.e., 10 kHz to $10^2$ MHz) or microwave energy (i.e., 0.1–10 GHz or $10^9$ hertz) at moderate power densities (i.e., 0.1–5 watts/cm$^2$). The frequency, power, and pressure are tailored to the precursor gas and equipment being used.

Some precursor gases that can be used include (1) mixtures of silanes or halosilanes such as trichlorosilane (HSiCl$_3$) in the presence of an alkane of 1–6 carbon atoms such as methane, ethane, and propane; (2) an allsilane such as methylsilane (CH$_3$SiH$_3$), dimethylsilane (CH$_3$)$_2$SiH$_2$, trimethylsilane (CH$_3$)$_3$SiH, and hexamethyldisilane (CH$_3$)$_3$Si—Si(CH$_3$)$_3$; or (3) a silacyclobutane or a disilacyclobutane of the type described in U.S. Pat. No. 5,011,706 to Sharp et al. incorporated by reference.

Examples of such silacyclobutanes (1) and disilacyclobutanes (2) are shown below. R1 is hydrogen, fluorine, or a hydrocarbon radical having 1–4 carbon atoms. R2 is hydrogen or a hydrocarbon radical having 1–4 carbon atoms. A preferred disilacyclobutane is 1,3-dimethyl-1,3-disilacyclobutane shown in formula (3).

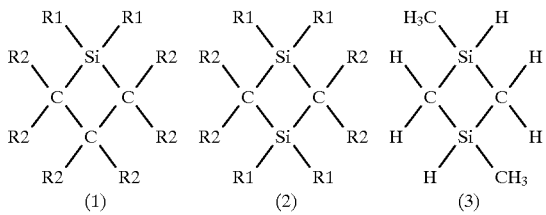

When silicon carbide is used as a coating layer, it is capable of forming a hermetic and electrical barrier over the surface of the silica-containing ceramic layer on the electronic device, and inhibits damage from chemical and mechanical means.

So that those skilled in the art can understand and appreciate the invention taught herein, the following examples are presented, it being understood that these examples should not be used to limit the scope of this invention found in the claims.

EXAMPLE 1

A 4" silicon wafer was spin coated at 1500 RPM for 20 seconds with Silvue® 101 (SDC Coatings, Inc., Anaheim, Calif.; 31 wt % solids of 40% SiO$_2$ and 60% partial condensate of CH$_3$Si(OH)$_3$ in methanol and isopropanol). Two coats of the resin solution were applied to the wafer, then the coated wafer was pyrolyzed at 400° C. in nitrogen for 1 hour. A thickness of 3.3 μm was obtained for the coating. The coating has a tensile stress value of 6.333e dynes/cm$^2$.

EXAMPLE 2

A 4" silicon wafer was spin coated at 1500 RPM for 20 seconds with Silvue® 101 (SDC Coatings, Inc., Anaheim, Calif.; 31 wt % solids in methanol and isopropanol). Two coats of the resin solution were applied to the wafer, then the coated wafer was pyrolyzed at 400° C. in oxygen for 1 hour. A thickness of 2.84 μm was obtained for the coating. The coating has a tensile stress value of 7.093e dynes/cm.

What is claimed is:

1. A method for forming a ceramic coating on an electronic substrate comprising applying onto an electronic substrate a coating composition comprising an aqueous alkanol dispersion of colloidal silica and partial condensate of RSi(OH)$_3$ where R is selected from the group consisting of an alkyl radical having from 1 to 3 carbon atoms, the vinyl radical, the 3,3,3-trifluoropropyl radical, the gamma-glycidoxypropyl radical and the gamma-methacryloxypropyl radical with the provision that at least 70% of the R radicals are methyl;

heating the coated electronic substrate at a temperature of 200° C. to 1000° C. to convert the coating composition into ceramic coating.

2. The method as claimed in claim 1 wherein the coated electronic substrate is heated at a temperature of 200° to 800° C.

3. The method as claimed in claim 1 wherein the coating composition additionally comprises 0.1 to 30 weight percent of a ceramic oxide precursor selected from the group consisting of compounds containing (1) an element from the group consisting of aluminum, titanium, zirconium, tantalum, niobium, vanadium, boron, phosphorous and (2) at least on hydrolyzable substituent selected from the group consisting of alkoxy, acetylacetonate and acyloxy.

4. The method as claimed in claim 1 wherein the coating composition additionally comprises a catalyst selected from the group consisting of platinum catalysts, rhodium catalysts, or copper catalysts in an amount to provide 5 to 1,000 parts per million platinum, rhodium, or copper based on the weight of the coating composition.

5. The method as claimed in claim 1 wherein the coating composition is applied to the electronic substrate by spin coating.

6. The method as claimed in claim 1 wherein the colloidal silica has a particle diameter in the range of 5 to 150 millimicrons.

7. The method as claimed in claim 1 wherein the aqueous alkanol dispersion of colloidal silica and partial condensate of RSi(OH)$_3$ contains 10–50 weight percent solids, with the distribution being 10–70 weight percent colloidal silica and 30–90 weight percent of the partial condensate.

8. The method as claimed in claim 1 wherein the heating is carried out in an oxidizing atmosphere.

9. The method as claimed in claim 1 wherein the heating is carried out in a non-oxidizing atmosphere.

10. The method as claimed in claim 1 wherein the method additionally comprises applying a second coating selected from the group consisting of SiO$_2$ coatings, SiO$_2$/ceramic oxide layers, silicon-containing coatings, silicon carbon containing coatings, silicon nitrogen containing coatings, silicon oxygen nitrogen containing coatings, silicon nitrogen carbon containing coatings, and diamond-like carbon coatings applied over the ceramic coating.

11. The method as claimed in claim 10 wherein the second coating is applied by chemical vapor deposition.

12. The method as claimed in claim 10 wherein the second coating is a silicon carbon containing coating.

* * * * *